United States Patent
Olsen et al.

(10) Patent No.: US 6,255,211 B1
(45) Date of Patent: Jul. 3, 2001

(54) SILICON CARBIDE STOP LAYER IN CHEMICAL MECHANICAL POLISHING OVER METALLIZATION LAYERS

(75) Inventors: Leif C. Olsen, Plano; Leland S. Swanson, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/410,310

(22) Filed: Oct. 1, 1999

Related U.S. Application Data
(60) Provisional application No. 60/102,732, filed on Oct. 2, 1998.

(51) Int. Cl.[7] .............................................. H01L 21/4763
(52) U.S. Cl. ........................ 438/624; 438/626; 438/631; 438/633; 438/634; 438/691; 438/692
(58) Field of Search ................................... 438/624, 626, 438/631, 633, 634, 691, 692

(56) References Cited

U.S. PATENT DOCUMENTS

| | | | |
|---|---|---|---|
| 4,975,144 | * 12/1990 | Yamazaki et al. | 156/643 |
| 5,017,264 | * 5/1991 | Yamazaki et al. | 156/643 |
| 5,240,554 | * 8/1993 | Hori et al. | 156/643 |
| 5,437,961 | * 8/1995 | Yano | 430/316 |
| 5,498,571 | * 3/1996 | Mori et al. | 437/189 |
| 5,998,100 | * 12/1999 | Azuma et al. | 430/313 |
| 6,025,273 | * 2/2000 | Chen et al. | 438/706 |
| 6,140,224 | * 10/2000 | Lin | 438/634 |
| 6,140,226 | * 10/2000 | Grill et al. | 438/637 |

\* cited by examiner

*Primary Examiner*—Richard Booth
*Assistant Examiner*—Lynne A. Gurley
(74) *Attorney, Agent, or Firm*—Carlton H. Hoel; W. James Brady; Frederick J. Telecky, Jr.

(57) ABSTRACT

Silicon carbide (SiC) is used as the stop layer for the chemical-mechanical polishing used to planarize the surface of interlevel dielectrics, making the resistance of the vias more uniform. Alternatively, silicon carbonitride or silicon carboxide can be used in place of silicon carbide.

10 Claims, 1 Drawing Sheet

SILICON CARBIDE STOP LAYER IN CHEMICAL MECHANICAL POLISHING OVER METALLIZATION LAYERS

This application claims benefit to Provisional application No. 60/102,732 filed Oct. 2, 1998.

BACKGROUND AND SUMMARY OF THE INVENTION

The present invention relates to integrated circuits structures and fabrication methods, and chemical mechanical polish (CMP) stops used for dielectric planarization over metallization.

Background: Chemical Mechanical Polishing

Chemical mechanical polishing (CMP) is a planarization technique which has become increasingly important in integrated circuit processing in the 1990s. CMP, unlike most other planarization techniques, provides global planarization. This global planarization avoids problems of step coverage, and hence helps achieve the numerous multiple layers of metallization which are now desired. Global planarization also improves lithographic resolution, by removing constraints on the depth of field.

However, optimum uniformity of CMP processes has not yet been achieved due to the relationship between polish rates and features sizes. To correct these problems, several schemes have been attempted, including the use of polish stop layers. These polish stop layers provide a flat, polish-resistant surface to be an endpoint in the planarization.

Background: Interlevel Dielectric over Metals

It is desirable to planarize the interlevel dielectric (ILD) used over metallization layers. Non-uniformity of the ILD is contributed to by the non-uniformity of underlying layers, variations in the ILD deposition process, and non-uniformity of planarization due to variations in pattern density. This lack of uniformity limits the minimum thickness of oxide which must be left over metal layers after CMP, but also causes variations in via resistances due to the variations in via depth through the oxide.

Background: Silicon Nitride as CMP Stop

Current state of the art uses silicon nitride as both a silicon etch hardmask and as a CMP stop layer for chemical-mechanical polishing (CMP). Since the removal selectivity of silicon dioxide to silicon nitride is only 4:1 or 5:1 using industry-accepted slurries, the silicon nitride layer is not an effective CMP polish stop layer. Non-uniformity due to polish and pattern effects can cause the dielectric SiO2 and Si3N4 over small isolated active device features to be polished much more quickly than other features, thus causing damage to these small active regions.

Some attempts have been made to achieve higher oxide:nitride selectivities by using other chemistries, but these attempts have required additional steps to be performed or required more expensive materials, so that more cost effective alternatives are sought.

Background: Silicon Carbide as CMP Stop

Applications commonly owned by the assignee of this application (attorney docket TI-26419P, 60/068,661, filed Dec. 23, 1997 and attorney docket TI-26419P1, provisional No. 60/086,215, filed May 21, 1998), both of which are hereby incorporated by reference, disclose the use of silicon carbide as an etch stop in the formation of such isolation features as trench isolation. In this application, standard polishing chemistries can very easily give an extremely high selectivity (50:1 or better) between silicon dioxide and silicon carbide.

Planarization Over Metal Lines

The present application discloses a method for planarizing the interlevel dielectric (ILD) material over metallization lines using silicon carbide layers as the stop layer in chemical mechanical polishing, or alternatively, using a silicon carbonitride or silicon carboxide.

Advantages of the disclosed methods and structures, in various embodiments, can include increased uniformity of the via resistances since the variation in oxide thicknesses over metal leads is reduced;

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Presently Preferred Embodiment

Figure 1:
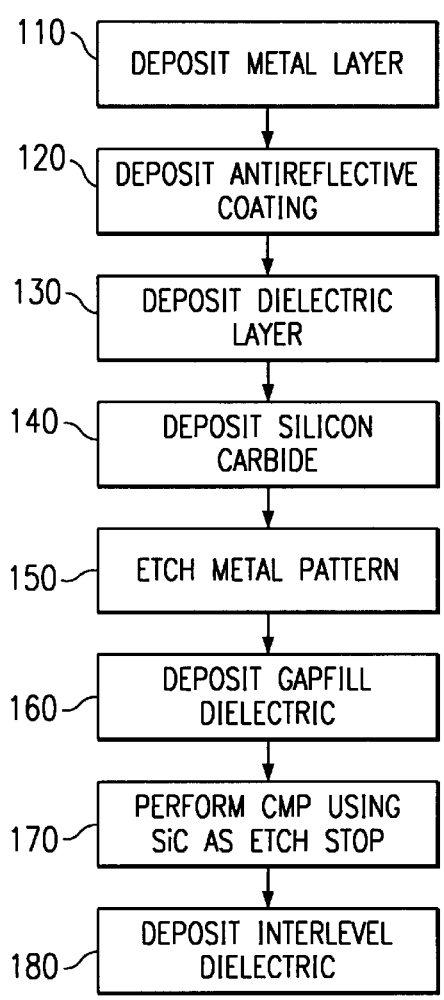
FIG. 1 is a flow chart showing key steps to planarize interlevel dielectric over a metal layer.
Figure 2:
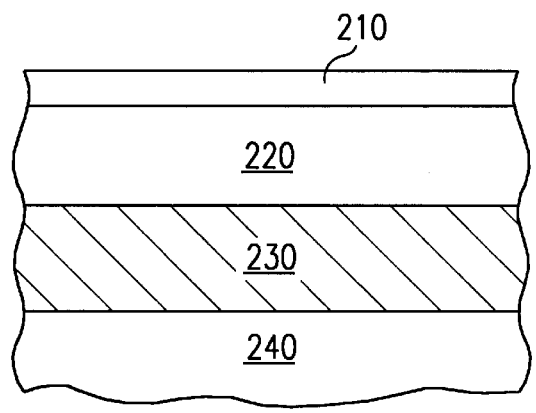
FIGS. 2–4 show a partially fabricated integrated circuit structure during various stages in the planarization process.
Figure 3:
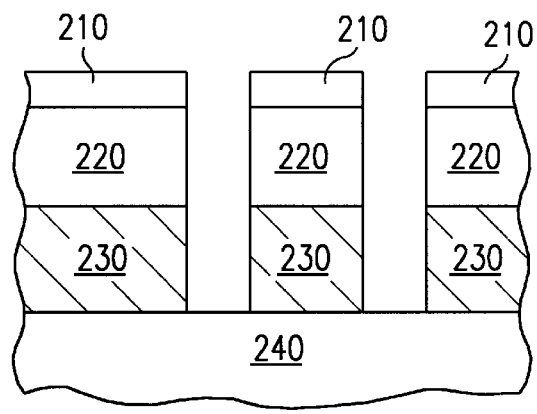
Figure 4:
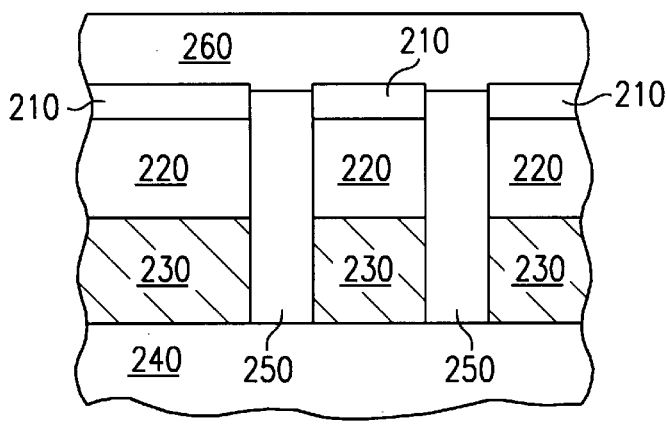

A first embodiment will now be discussed with reference to FIG. 1, which shows a flow chart for the planarization process, and FIGS. 2–4, which show this embodiment during various stages of the process. The same numbers will be used to refer to similar elements in all figures.

Metal layer 230 is deposited (step 110) on a pre-planarized surface 240, e.g., a pre-metal dielectric (PMD) or previous interlevel dielectric (ILD) layer. In the presently preferred embodiment, metal layer 230 is a layer of aluminum approximately 450–650 nm thick. A layer of TiN (not shown), approximately 15–40 nm thick, is deposited (step 120) to serve as an anti-reflective coating (ARC) and via etch stop, followed by deposition (step 130) of approximately 10–200 nm of a dielectric, such as SiO2, over the unpatterned metal. A layer of 30–100 nm of silicon carbide (SiC) 210 is then deposited (step 140) over the oxide using chemical vapor deposition (CVD), giving the structure depicted in FIG. 2.

In the presently preferred embodiment, the silicon carbide is deposited in a single plasma-enhanced chemical vapor deposition (PECVD) process, with the following recipe:
Source gas: silane/methane, trimethylsilane, or other organosilicon gas;
Carrier gas: Ar or He;
Pressure about 2–8 Torr;
Gas flow 500–5000 sccm;
RF power density about 2 W/cm2 (13.56 MHz);
Substrate temperature 200–500 (preferably 350) degrees C.

An antireflective coating can be formed as part of the SiC deposition, e.g., by the addition of a small amount of nitrogen in the gas flow at the end of the process, forming silicon-carbonitride in the uppermost portion of the layer (not shown).

The SiC is covered by a photoresist (not shown), which is then patterned to remain only in regions where a metallization line is desired. FIG. 3 shows the chip after the metallization pattern has been etched (step 150) through silicon carbide layer 210, oxide layer 220; and metal layer 230, using appropriate etches for each layer, and the resist ashed.

A gapfill dielectric material 250, such as a high density plasma (HDP) deposition of SiO2, is deposited (step 160) so that the gaps between tightly pitched metal lines are filled, with preferably an additional 50 nm of gapfill dielectric deposited over the metallization structures. Then chemical-mechanical polishing (CMP) is used to polish (step 170) the surface dielectric layer, stopping on the silicon carbide layer remaining over the metal layer. An example of polish parameters is given in co-pending provisional application No. 60/086,215, filed May 21, 1998, which is incorporated by reference. It is expected that CMP selectivities of silicon carbide to PECVD SiO2 will be very high, in the range of 1:120. This is followed by deposition (step 180) of an interlevel dielectric 260, giving the structure of FIG. 4.

Finally, processing continues with the formation of further metallization layers or a protective overcoat.

First Etch Embodiment for SiC

In a first embodiment, the etch uses a chemistry of CF4/O2/H2/Ar, with an O2 fraction of 0–90 percent, H2 flow of 0–20 sccm, (fluorinated-O2 gas flow of 10–50 sccm), Ar flow of 10–100 sccm, chamber pressure of about 10–50 mTorr, RF Power density of about 0.5–4 W/cm2 (13.56 MHz), and magnetic field of 0–30 G.

Second Etch Embodiment for SiC

In an alternate embodiment, the etch uses a SF6/O2/H2/Ar chemistry, with an O2 fraction of 0–90%, H2 flowrate of 0–20 sccm, (fluorinated-O2 gas flow 10–50 sccm), Ar flow of 10–100 sccm, a chamber pressure of about 10–50 mTorr, RF Power density of about 0.5–4 W/cm2 (13.56 MHz), and magnetic field of 0–30 G.

Third Etch Embodiment for SiC

In an alternate embodiment, the etch uses a chemistry of NF3/CHF3/CF4/Ar/O2/H2, with an O2 fraction of 0–50 percent, H2 flow of 0–100 sccm, (fluorinated-Ar gas flow of 50–200 sccm), Ar flow of 10–100, chamber pressure of about 10–50 mTorr, RF Power density of approximately 0.5–4 W/cm2 (13.56 MHz), and magnetic field of 0–30 G.

Fourth Etch Embodiment for SiC

In a further alternate embodiment, the process used to etch the silicon carbide is a Cl2/CF4/O2 etch, at about 300 mTorr, with gas flow of 10–300 sccm, Ar flow of 0–100 sccm, O2 flow of 0–50 sccm, CF4 flow of 0–50 sccm, RF power density of about 0.5–4 W/cm2 (13.56 MHz), and magnetic field of 0–30 G.

Alternate Embodiments: Alloys of SiC

Alloys of silicon carbide with other materials are also possible CMP stop layers, however, it is important to maintain material hardness and resistance to chemical attack by the slurry.

SixCyNz

In one alternate embodiment, silicon carbide is alloyed with nitrogen to form a silicon carbonitride.

SixCyOz

In another alternate embodiment, silicon carbide is alloyed with oxygen to form a silicon carboxide layer. This embodiment is generally less preferred, as CMP selectivity to oxide is not as easy to obtain with this material, due to its own oxide bonds.

SiwCxNyOz

In another alternate embodiment, silicon carbide is alloyed with both nitrogen and oxygen, forming a silicon carboxynitride.

Alternate Embodiment: Use with Copper Metallization

Processes are being developed to deposit and pattern copper circuitry in much the same manner as aluminum, rather than the Damascene process generally used for copper. In an alternate embodiment, a layer primarily of copper is used instead of the aluminum of the primary embodiment.

Alternate Embodiment: Dummy Features Improve Planarization

In an alternate embodiment, dummy metallization features, having no connections to active or passive devices, can be created to further improve planarization of the layer.

According to a disclosed class of innovative embodiments, there is provided: A fabrication method, comprising the steps of: (a.) forming a layer of a dielectric material over a layer of conductive material, said dielectric material encasing a layer comprising silicon and carbon; (b.) planarizing said dielectric material using said layer comprising silicon and carbon as a planarization stop layer.

According to another disclosed class of innovative embodiments, there is provided: A fabrication method, comprising the steps of: (a.) forming a planarization stop layer, which comprises silicon and carbon, over an unpatterned layer of a conductive material; (b.) etching a pattern in said planarization stop layer and said layer of conductive material; (c.) filling gaps between remaining portions of said planarization stop layer and said layer of conductive material with a dielectric material; (d.) planarizing said dielectric material using said planarization stop layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the disclosed gapfill dielectric can be replaced with other low-k materials which are durable enough to stand up to the process of chemical-mechanical polishing.

What is claimed is:

1. A fabrication method, comprising the steps of:
   (a.) forming a layer of a dielectric material over a layer of conductive material, said dielectric material encasing a layer comprising silicon and carbon;
   (b.) planarizing said dielectric materials using said layer comprising silicon and carbon as a planarization stop layer.

2. The method of claim 1, wherein said layer comprising silicon and carbon is SiC.

3. The method of claim 1, wherein said conductive material comprises aluminum.

4. The method of claim 1, wherein said dielectric material comprises SiO2.

5. The method of claim 1, wherein said planarizing step uses chemical-mechanical polishing.

6. A fabrication method, comprising the steps of:
   (a.) forming a planarization stop layer, which comprises silicon and carbon, over an unpatterned layer of a conductive material;
   (b.) etching a pattern in said planarization stop layer and said layer of conductive material;
   (c.) filling gaps between remaining portions of said planarization stop layer and said layer of conductive material with a dielectric material;
   (d.) planarizing said dielectric material using said planarization stop layer.

7. The method of claim 6, wherein said planarization stop layer is SiC.

8. The method of claim 6, wherein said conductive material comprises aluminum.

9. The method of claim 6, wherein said dielectric material comprises SiO2.

10. The method of claim 6, wherein said planarizing step uses chemical-mechanical polishing.

* * * * *